United States Patent [19]
Li et al.

[11] Patent Number: 6,033,967
[45] Date of Patent: Mar. 7, 2000

[54] METHOD FOR INCREASING CAPACITANCE IN DRAM CAPACITORS AND DEVICES FORMED

[75] Inventors: Mei-Yen Li, Hsin-Chiu; L. C. Chen, Hsin-Chu, both of Taiwan

[73] Assignee: Taiwan Semiconductor Manufacturing Co., Ltd., Hsin-Chu, Taiwan

[21] Appl. No.: 08/897,348

[22] Filed: Jul. 21, 1997

[51] Int. Cl.⁷ .................................................. H01L 21/20
[52] U.S. Cl. ........................................... 438/398; 438/255
[58] Field of Search ..................... 438/398, 396, 438/255, 253

[56] References Cited

U.S. PATENT DOCUMENTS

| | | | |
|---|---|---|---|
| 5,110,752 | 5/1992 | Lu ............................................. | 438/398 |
| 5,244,842 | 9/1993 | Cathey et al. ........................... | 438/398 |
| 5,543,347 | 8/1996 | Kawano et al. ......................... | 438/398 |
| 5,760,434 | 6/1998 | Zahurak et al. ......................... | 438/398 |
| 5,766,968 | 6/1998 | Armacost et al. ....................... | 438/398 |

*Primary Examiner*—Tuan H. Nguyen
*Attorney, Agent, or Firm*—Tung & Associates

[57] ABSTRACT

The present invention discloses a method for increasing capacitance in DRAM capacitors by the operating steps of first providing a cavity in a semiconductor substrate, then depositing a first polysilicon layer in the cavity, and a metal layer on top of the polysilicon layer to form a silicide layer. The semiconductor substrate is then heat treated in a rapid thermal processing method so that the metal silicide layer forms an island structure on top of the first polysilicon layer. The first polysilicon layer can then be isotropically etched by using the metal silicide island structure as a mask to form an island structure in the first polysilicon layer. Additional dielectric layer and polysilicon layers are then deposited to form the insulating layer and the upper electrode for the capacitor. The increased surface area, i.e., approximately two times, of the lower electrode polysilicon layer greatly increases its storage area for the capacitor and therefore greatly improves its capacitance.

17 Claims, 3 Drawing Sheets

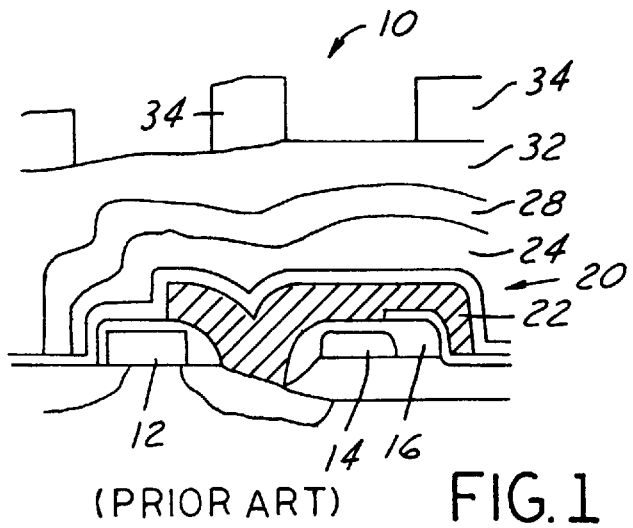
(PRIOR ART) FIG.1
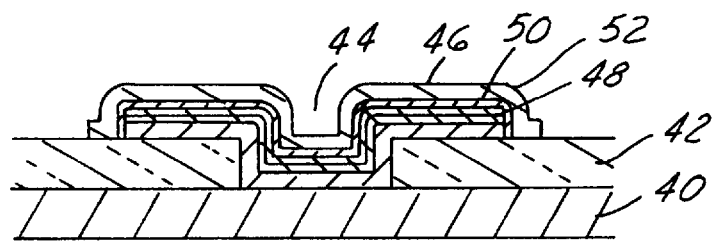
(PRIOR ART) FIG.2
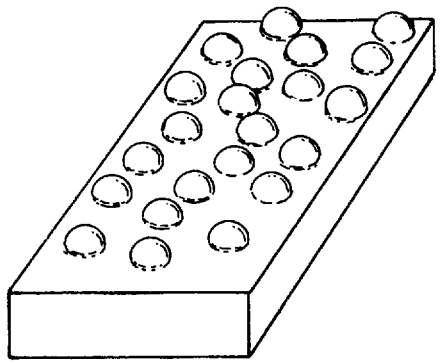
FIG.3

METHOD FOR INCREASING CAPACITANCE IN DRAM CAPACITORS AND DEVICES FORMED

FIELD OF THE INVENTION

The present invention generally relates to a dynamic random access memory (DRAM) capacitor and a method of making and more particularly, relates to a DRAM capacitor that has increased capacitance by forming an island structure in a polysilicon lower electrode by first forming a metal silicide layer having the same island structure on top and the DRAM capacitors formed.

BACKGROUND OF THE INVENTION

A typical DRAM cell includes a transistor and a storage capacitor. In the early DRAM cells, storage capacitors of the planar type were used which require the use of large wafer real estate. In recent years, as the size of IC device is continuously miniaturized when smaller chips are made and more devices are packed into the chips, the circuit density on the chip increases to such an extent that the specific capacitance of a storage capacitor must be increased in order to meet such demand. Since chip real estate is limited, the only feasible way of increasing the specific capacitance of a storage capacitor is to increase it three-dimensionally, i.e., to grow the capacitor cell in the vertical dimension forming a stacked capacitor.

A stacked capacitor is built on top of a transistor thus allowing a smaller cell to be built without losing the specific capacitance. It has become a popular design in modern semiconductor memory devices for saving chip real estate. Other approaches such as the formation of a deep trench capacitor for storing charges vertically requires a deep trench formation and thus encounters various processing difficulties.

In modern memory cells, where smaller dimension and higher specific capacitance are desirable characteristics, a DRAM capacitor can be formed by two layers of a semi-conducting material and one layer of a dielectric material sandwiched thereinbetween. A suitable dielectric material utilized in such a capacitor includes a thin oxide layer or a composite oxide-nitride-oxide layer sandwiched between two semi-conducting layers of polysilicon for forming the capacitor cell. The capacitor is frequently formed over a bit line on the surface of a silicon substrate.

A typical 16-Mb DRAM cell is shown in FIG. 1. The DRAM cell 10 has a stacked capacitor 20 built on top. The formation of the DRAM cell 10 can be accomplished by first using standard CMOS fabrication steps to form the transistor and providing a gate oxide layer (not shown). A word line 12 is then formed by first depositing a polysilicon layer of approximately 2500 Å and then doping the polysilicon with phosphorous. A thick layer of insulating material 16 such as TEOS (tetraethoxy silicate) oxide of approximately 3,000 Å is then deposited on top of the first polysilicon layer. By using standard photomasking processes, the two layers are etched by a plasma etching technique. After LDD implants are made in the silicon substrate, oxide spacers are formed on the polysilicon gate structure by depositing a thick layer of TEOS oxide of approximately 2,000 Å and then etched by a plasma process. Gates 12 and 14 are thus formed and covered by a thick oxide insulating layer 16. A source and drain mask is then applied to carry out an ion implantation process for forming the source and drain regions in the silicon substrate.

In the next fabrication step, photomasking is used to form openings for the cell contact and plasma etching is used to remove any native oxide layer on the silicon substrate. A second polysilicon layer 22 of approximately 3,500 Å is then deposited and patterned by a photomask to form the lower electrode of the stacked capacitor 20. A dielectric layer 24 of a composite film of oxide-nitride-oxide (ONO) is deposited as the dielectric layer for the capacitor. The total thickness of the ONO composite film is approximately 70 Å. The ONO composite film can be formed by using a thin layer of native oxide as the first oxide layer, depositing a thin nitride layer on top and then oxidizing the nitride layer to grow a top oxide layer. To complete the fabrication of the stacked capacitor, a third polysilicon layer 24 of approximately 2,000 Å thick is deposited on top of the dielectric layer and then doped and patterned by a photomask to form an upper electrode. After the formation of the stacked capacitor, peripheral devices can be formed by masking and ion implantation, followed by the formation of a bit line 28 of a polysilicon/metal silicide material. A thick insulating layer 32 of BPSG or SOG is then deposited over the capacitor and reflowed to smooth out the topography and to reduce the step height. Other back-end-processes such as metalization to form metal lines 34 are used to complete the fabrication of the memory device 10.

The stacked capacitor 10 shown in FIG. 1 has been successfully used in 16 Mb DRAM devices. However, as device density increases to 256 Mb or higher, the planar surface required for building this type of conventional stacked capacitors becomes excessive and must be reduced.

Another technique of forming DRAM stack capacitors by using a rugged polysilicon layer as the lower electrode in a capacitor cell is shown in FIG. 2. Referring now to FIG. 2, wherein a semiconductor substrate 40 is shown which has a layer of a non-doped silicate glass 42 deposited on top. After the insulating layer 42 is patterned and etched in a conventional etching process, the substrate area 44 is exposed as the storage node capacitor cell contact. In the next processing step, a layer of polysilicon 46 is deposited and formed. The thickness of the polysilicon layer 46 is in the range between about 400 Å and about 600 Å. To increase the surface area of the polysilicon layer, a rugged surface polysilicon layer 48 is deposited at a relatively low deposition temperature of between about 500° C. and about 600° C. by a chemical vapor deposition technique. The deposition temperature of the rugged polysilicon must be kept low in order to maintain the wave-like surface texture of the rugged polysilicon. The thickness of the rugged polysilicon layer 48 is between about 700 Å and about 1000 Å. In a subsequent process, the polysilicon layer 46 and the rugged polysilicon layer 48 are patterned and etched to form a lower electrode of the capacitor cell. A second insulating layer, preferably of an oxide or an oxide-nitride-oxide insulating layer 50 is deposited by a chemical vapor deposition technique. After the second insulating layer 50 is patterned and etched to form a conformal layer on the capacitor cell, a final layer 52 of polysilicon is deposited by chemical vapor deposition and formed as the upper electrode in the capacitor cell. Even though a storage capacitor having improved storage capacity can be fabricated by this process, the fabrication process is complicated since a low temperature formation of the rugged polysilicon layer is required. Furthermore, in a capacitor cell that utilizes rugged polysilicon, the device must not be subjected in a down-stream fabrication step to at a temperature of higher than 600° C. which would render the wave-like textured surface of the rugged polysilicon smooth and loses its increased storage capacity.

It is therefore an object of the present invention to provide a method for forming a DRAM capacitor that has improved storage capacity and not the drawbacks or shortcomings of the conventional capacitors.

It is another object of the present invention to provide a method for forming a DRAM capacitor that has improved storage capacity but does not require the formation of low temperature rugged polysilicon as an electrode of the capacitor.

It is a further object of the present invention to provide a method for forring a DRAM capacitor that has improved storage capacity by depositing a metal layer on a polysilicon forming a metal silicide and then heat treating the metal suicide at a temperature sufficient to form an island structure.

It is another further object of the present invention to provide a method for forming a DRAM capacitor by first forming a metal silicide layer having an island structure on a polysilicon layer and then isotropically etching the polysilicon layer into the same island structure for use as a lower electrode of the capacitor.

It is yet another object of the present invention to provide a method for forming a DRAM capacitor that has improved storage capacity by the formation of a metal suicide layer that is capable of forming an island structure after a rapid thermal process.

It is another object of the present invention to provide a method for forming a DRAM capacitor that has improved storage capacity by using a metal silicide layer formed on a polysilicon layer that develops an island structure after heat treating to a temperature higher than 500° C.

It is still another further object of the present invention to form a DRAM capacitor that has improved storage capacity by using a molybdenum suicide layer capable of forming an island structure after exposure to 600° C. and then isotropically etching the underlying polysilicon layer into the same island structure for use as the lower electrode.

It is yet another further object of the present invention to provide a DRAM capacitor that has improved storage capacity by using a lower electrode formed of polysilicon and etched into an island structure such that its surface area is increased to improve its storage capacity.

SUMMARY OF THE INVENTION

In accordance with the present invention, a method for forming a DRAM capacitor that has improved storage capacity by depositing a metal layer on a polysilicon layer and then forming a metal silicide which transforms to an island structure to isotropically etch the underlying polysilicon into the same island structure for use as the lower electrode is provided.

In a preferred embodiment, a method for forming a DRAM capacitor that has improved storage capacity can be carried out by first providing a cavity in a semiconductor substrate, then depositing a polysilicon layer in the cavity, then depositing a metal layer on the polysilicon forming a metal suicide layer, then heat treating the metal suicide layer at a temperature sufficient to form an island structure, then isotropically etching the polysilicon into the same island structure, and removing the metal silicide layer.

In another preferred embodiment, a method for increasing capacitance in DRAM capacitors can be carried out by first providing a cavity in a semiconductor substrate, then depositing a first polysilicon layer in the cavity, then depositing a metal layer on the first polysilicon layer forming a metal silicide layer, heat treating the metal silicide at a temperature sufficient to form an island structure, and dry etching the first polysilicon layer using the metal silicide layer as a mask to form the same island structure in the first polysilicon layer. The method may further include the steps of removing the metal silicide layer, depositing a dielectric layer on the first polysilicon layer, and depositing a second polysilicon layer on the dielectric layer to form an upper electrode.

The present invention is also directed to a DRAM capacitor that has increased storage area including a cavity in a semiconductor substrate, a first polysilicon layer in the cavity which has a substantially island structure, a dielectric layer on top of the polysilicon layer, and a second polysilicon layer on top of the dielectric layer, wherein the island structure in the first polysilicon layer provides the increased storage area for the capacitor.

BRIEF DESCRIPTION OF THE DRAWINGS

These and other objects, features and advantages of the present invention will become apparent from the following detailed description and the appended drawings in which:

FIG. 1 is an enlarged, cross-sectional view of a conventional stacked capacitor DRAM cell.

FIG. 2 is an enlarged, cross-sectional view of a conventional DRAM capacitor cell utilizing a rugged polysilicon layer as the lower electrode.

FIG. 3 is a perspective view of a model for surface area gain calculations used in the present invention method.

DETAILED DESCRIPTION OF THE PREFERRED AND ALTERNATE EMBODIMENTS

The present invention discloses a method for making a DRAM capacitor that has improved storage capacity by using a metal silicide layer that has an island structure as a mask and isotropically etching an underlying polysilicon layer into the same island structure such that the surface area of the polysilicon layer is increased to improve its storage capacity. The metal used to form the metal silicide layer can be selected from molybdenum, titanium, nickel, cobalt, ytterbium, germanium, strontium, gold and silver. Some of these elements may not form a silicide, i.e., germanium, strontium, gold and silver, even though, they form island structures when deposited on a silicon surface. It has been found that a suitable temperature that is sufficient for the metal silicide layers to form an island structure is at least 500° C., and preferably at least 600° C.

The present invention novel method for increasing the surface area of a polysilicon layer such that it can be used as the lower electrode is first demonstrated by a mathematical equation for calculating the maximum area gain. In a most dense array, shown in FIG. 3, the surface area gain can be calculated as the ratio between the surface area of the etched-back $MoSi_2$ island structure to the surface area of a flat surface. This can be expressed as:

$$\text{Surface Area Gain} = \frac{\text{Surface Area of Etched-Back } MoSi_2 \text{ Island Structure}}{\text{Surface Area of a Flat Surface}}$$

$$= \frac{\pi r^2 + \left(\sqrt{3} - \frac{\pi}{2}\right)r^2}{\sqrt{3}r^2}$$

$$= 1 + \frac{\sqrt{3}\pi}{6}$$

$$= 1.91$$

Figure 4A:
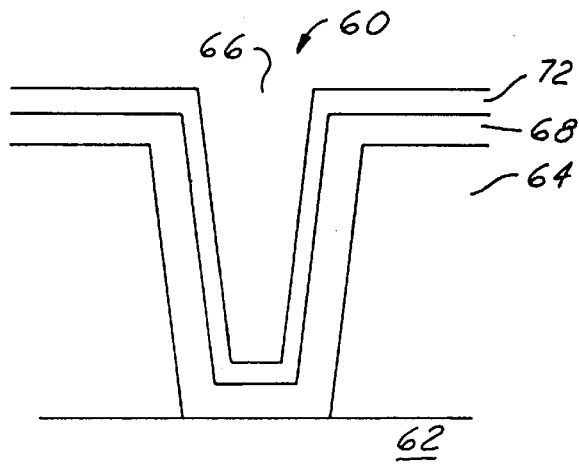
FIG. 4A is an enlarged, cross-sectional view of the present invention capacitor well which has a doped polysilicon layer and a molybdenum metal layer deposited on top.

As shown by the above equation, the surface area gain is calculated at 1.91 times of the original surface area without the island structure or the protrusions. The maximum surface area gain which leads to a proportional capacitance gain can therefore significantly improve the storage capacity of the present invention DRAM capacitor Referring now to FIG. 4A, wherein an enlarged, cross-sectional view of a present invention semiconductor device 60 is shown. The semiconductor device 60 is built on a substrate 62 which has an insulating layer of oxide 64 deposited thereon. A capacitor well, or contact hole 66 is then formed by conventional photolithographic method. Into the capacitor well 66, a polysilicon layer 68 is first deposited to a suitable thickness of between about 1000 Å and about 8000 Å. The polysilicon layer 68 is normally doped to improve its electrical properties. Onto the polysilicon layer 68, a thin layer 72 of metal is then deposited. The thickness of the metal can be suitably selected in between about 10 Å and 100 Å, and preferably between about 15 Å and about 45 Å. The metal material can be suitably selected from molybdenum, titanium, nickel, cobalt or ytterbium. Other metallic materials such as germanium, strontium, gold and silver, eventhough do not form metal silicide, can also be used since they form island structures when deposited on a silicon surface. A frequently used metallic material is molybdenum which forms molybdenum suicide readily.

Figure 4B:
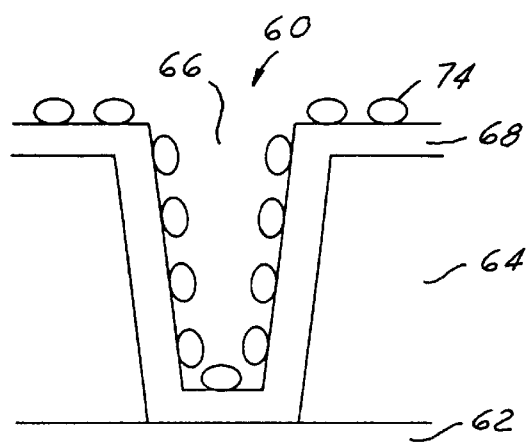
FIG. 4B is an enlarged, cross-sectional view of the present invention structure shown in FIG. 4A after a rapid thermal process is conducted to form an island structure in the molybdenum silicide film.

After the metal layer 72 is deposited, the semiconductor device 60 is processed in a rapid thermal processing (RTP) apparatus such that the metal silicide film formed between layers 68 and 72 can be transformed to an island structure 74. This is shown in FIG. 4B. The island structure can be formed by the rapid thermal processing technique at a temperature of not less than 500° C., and preferably not less than 600° C. The island structure 74 formed consists of individual islands each having a diameter between about 100 Å and about 1000 Å, and preferably between about 200 Å and about 400 Å. The formation of the island structure is presumably caused by the surface tension of the metal silicide material and its tendency to exist in a state which has the lowest potential energy.

Figure 4C:
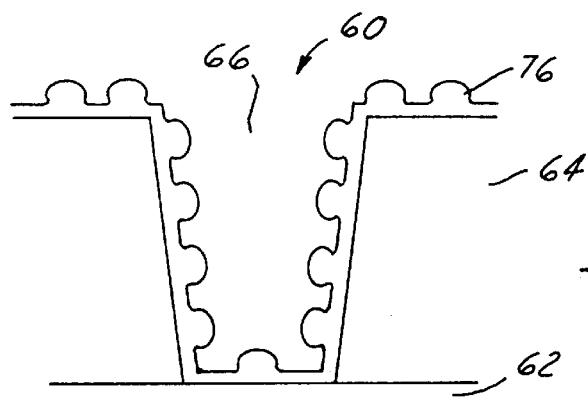
FIG. 4C is an enlarged, cross-sectional view of the present invention structure of FIG. 4B after the polysilicon layer is etched back to form an island structure.

In the next step of the process, the present invention novel method can be carried out by using the island structure 74 formed by the metal silicide as a mask and subjecting the semiconductor device 60 to an isotropic etching process. The polysilicon layer 68, as shown in FIG. 4B, can be dry etched in a reactive ion etching process to form the island structure 76, as shown in FIG. 4C. Polysilicon which is deposited by a low pressure chemical vapor deposition technique has superior interfacial property with the oxide insulating layers 64. Anisotropic etching and the high etch selectivity between polysilicon and oxide enable the etching process to be easily conducted in the reactive ion etching process. It has been found that most chlorine-based and bromine-based etchants can be used for etching polysilicon to achieve the required etch profile and selectivity. The etching process utilizes the metal silicide island structure 74 as an etch mask such that a substantially similar island structure 76 in the polysilicon layer can be obtained. A bromine-based etchant is more desirable than a chlorine-based etchant due to its higher etch selectivity of polysilicon to oxide. For instance, a HBr plasma can be suitably used to etch polysilicon in the present invention novel method. Isotropic etching used in the present invention method is desirable to achieve etching in both directions perpendicular and parallel to the substrate surface.

Figure 4D:
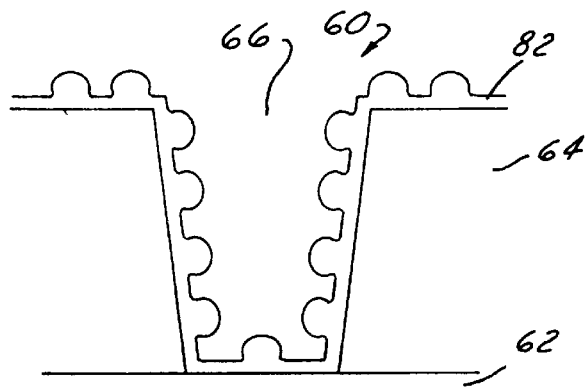
FIG. 4D is an enlarged, cross-sectional view of the present invention structure of FIG. 4C after the lower electrode of the polysilicon layer is defined.

After the island structure 76 in the polysilicon film is formed, the metal siuicide layer 74 can be removed by a suitable etchant in the same reactive ion etching chamber. It is also possible that metal silicide layer 74 can be removed in the same etching process for the polysilicon layer 76 if a suitable etchant is selected. This would be most desirable from a process simplification point of view. After the metal suicide layer 74 is removed, the polysilicon island structure 76 can be defined and formed into a lower electrode 82 for the capacitor. This is shown in FIG. 4D. The island structure 76 can also be defined at a later process, i.e., after the top capacitor plate 86 formation.

Figure 4E:
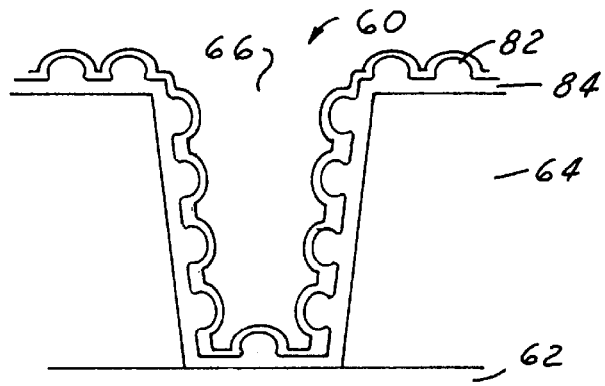
FIG. 4E is an enlarged, cross-sectional view of the present invention structure of FIG. 4D after a dielectric layer is deposited on top of the polysilicon layer.
Figure 4F:
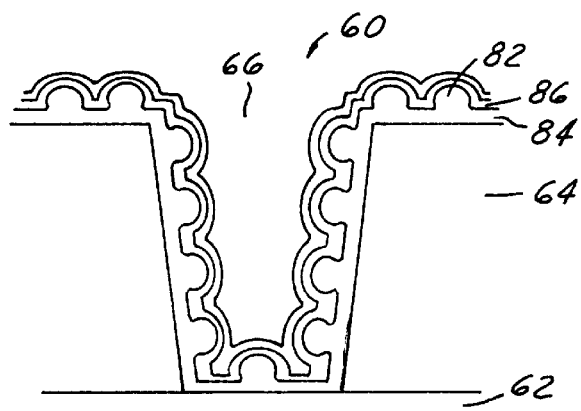
FIG. 4F is an enlarged, cross-sectional view of the present invention structure of FIG. 4E after a second polysilicon layer is deposited to form the cell plate.
Figure 4G:
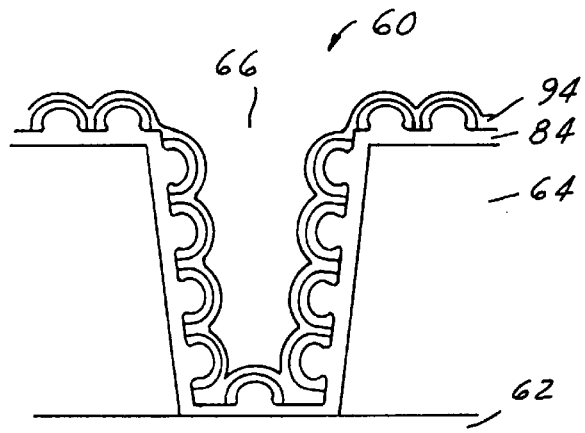
FIG. 4G is an enlarged, cross-sectional view of the present invention structure of FIG. 4F after the capacitor cell is defined.

In the subsequent processing steps, as shown in FIGS. 4E, 4F and 4G, conventional techniques are used to deposit a thin dielectric layer 84, shown in FIG. 4E, to deposit a second polysilicon layer 86 on top of the dielectric layer 84, shown in FIG. 4F, and to define an upper electrode 90, shown in FIG. 4G to complete the capacitor structure. The dielectric layer 84 deposited can be either of oxide or of oxide-nitride-oxide to a thickness between about 50 Å and about 200 Å. The second polysilicon layer 86 can be deposited by a similar technique and to a similar thickness for the first polysilicon layer 68. The capacitor is formed by a standard photolithographic technique to the final structure shown in FIG. 4G.

Figure 5:
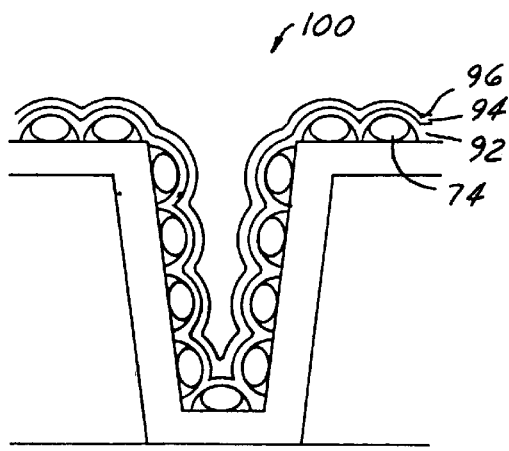
FIG. 5 is an enlarged, cross-sectional view of an alternate embodiment of the present invention wherein the metal silicide layer is not removed and the capacitor is built on top of the silicide layer.

In an alternate embodiment of the present invention method, the metal silicide layer 74 in the island structure is left on the first polysilicon layer 68 and not removed from the semiconductor device 100. This is shown in FIG. 5. A thin layer of polysilicon 92, having a thickness between about 1000 Å and about 5000 Å, is then deposited on top of the island structure 74 as a lower electrode. A dielectric layer 94 and a third polysilicon layer 96 are then subsequently deposited for forming the insulating layer and the upper electrode for the capacitor. The thicknesses of the dielectric layer 94 may be in the range between about 50 Å and about 200 Å, while the thickness for the third polysilicon layer 96 may be between about 1000 Å and about 5000 Å. The capacitor is then defined by standard photolithographic method. The structure 100 achieved by the alternate embodiment method shown in FIG. 5 has the advantage that the metal silicide layer 74 need not be removed and thus one processing step is saved. The same desirable benefits of the present invention novel method can be realized by depositing additional layers of polysilicon and dielectric material on top of the metal silicide. The alternate embodiment shown in FIG. 5 is desirable in situations where the removal of the metal silicide layer 74 may be difficult and where it is more desirable to leave the metal silicide layer in the capacitor well.

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the inventions.

The embodiment of the invention in which an exclusive property or privilege is claimed are defined as follows:

1. A method for forming a DRAM capacitor comprising the steps of:

providing a cavity in a semiconductor substrate, depositing a polysilicon layer in said cavity, depositing a metal layer on said polysilicon layer forming a layer of metal silicide, heat treating said metal suicide layer at a temperature sufficient to form an island structure, isotropically etching said polysilicon into an island structure, and removing said metal suicide layer.

2. A method according to claim 1, wherein said metal layer is deposited of a material selected from the group consisting of molybdenum, titanium, nickel, cobalt, ytterbium, germanium, strontium, gold and silver.

3. A method according to claim 1, wherein said temperature sufficient to form an island structure is at least 500° C.

4. A method according to claim 1 further comprising the steps of:

defining said polysilicon layer into a lower electrode, depositing an insulating layer on said polysilicon layer, and depositing a second polysilicon layer on said insulating layer forming an upper electrode.

5. A method according to claim 4, wherein said insulating layer is deposited of oxide or oxide-nitride-oxide.

6. A method according to claim 1, wherein said anisotropic etching is conducted in a reactive ion etching or a high density plasma etching process.

7. A method according to claim 1, wherein said anisotropic etching step and said removal of metal silicide step are conducted in the same dry etching process.

8. A method according to claim 1, wherein said island structure is formed by a rapid thermal processing technique.

9. A method according to claim 1, wherein said island structure is formed by islands each having a diameter between about 100 Å and about 1000 Å.

10. A method for increasing capacitance in DRAM capacitors comprising the steps of:

providing a cavity in a semiconductor substrate, depositing a first polysilicon layer in said cavity, depositing a metal layer on said first polysilicon layer forming a metal silicide layer, heat treating said metal silicide layer at a temperature not less than 500° C. forming an island structure, and dry etching said first polysilicon layer by using said metal silicide layer as a mask forming an island structure in said first polysilicon layer.

11. A method according to claim 10 further comprising the steps of:

removing said metal silicide layer, depositing a dielectric layer on said first polysilicon layer, depositing a second polysilicon layer on said dielectric layer forming an upper electrode.

12. A method according to claim 11, wherein said metal silicide formed is molybdenum suicide.

13. A method according to claim 11, wherein said dielectric layer deposited is an oxide or oxide-nitride-oxide layer.

14. A method according to claim 11, wherein said first and said second polysilicon layers deposited are doped polysilicon.

15. A method according to claim 10 further comprising the steps of:

depositing a second polysilicon layer on said metal suicide layer forming a lower electrode, depositing a dielectric layer on said second polysilicon layer, depositing a third polysilicon layer on said dielectric layer forming an upper electrode.

16. A method according to claim 10, wherein said metal layer is deposited of a material selected from the group consisting of molybdenum, titanium, nickel, cobalt, ytterbium, germanium, strontium, gold and silver.

17. A method according to claim 10, wherein said dry etching is conducted isotropically in a reactive ion etching process.

* * * * *